(12) United States Patent
Zhang et al.

(10) Patent No.: US 8,871,425 B2
(45) Date of Patent: Oct. 28, 2014

(54) LOW DIELECTRIC PHOTOIMAGEABLE COMPOSITIONS AND ELECTRONIC DEVICES MADE THEREFROM

(75) Inventors: Ruzhi Zhang, Pennington, NJ (US); Jihoon Kim, Huntingdon Valley, PA (US); Bharatkumar K. Patel, Edison, NJ (US); Elizabeth Wolfer, Bethlehem, PA (US)

(73) Assignee: AZ Electronic Materials (Luxembourg) S.A.R.L., Luxembourg (LU)

( * ) Notice: Subject to any disclaimer, the term of this patent is extended or adjusted under 35 U.S.C. 154(b) by 151 days.

(21) Appl. No.: 13/369,809

(22) Filed: Feb. 9, 2012

(65) Prior Publication Data

US 2013/0209754 A1    Aug. 15, 2013

(51) Int. Cl.
*G03F 7/00* (2006.01)
*G03F 7/11* (2006.01)

(52) U.S. Cl.
USPC ............... 430/270.1; 430/272.1; 430/913

(58) Field of Classification Search
USPC .................. 430/270.1, 272.1, 913, 905
IPC .............. G03F 7/004, 7/0042, 7/0043, 7/075
See application file for complete search history.

(56) References Cited

U.S. PATENT DOCUMENTS

| 4,442,197 | A | 4/1984 | Crivello et al. |
| 4,603,101 | A | 7/1986 | Crivello |
| 4,624,912 | A | 11/1986 | Zweifel et al. |
| 6,251,486 | B1 * | 6/2001 | Chandross et al. ......... 427/387 |
| 6,274,286 | B1 | 8/2001 | Hatakeyama et al. |
| 6,803,171 | B2 * | 10/2004 | Gronbeck et al. ......... 430/270.1 |
| 7,018,678 | B2 * | 3/2006 | Gronbeck et al. ......... 427/387 |
| 8,013,077 | B2 * | 9/2011 | Morita ......................... 525/431 |
| 8,356,407 | B2 * | 1/2013 | Anderson et al. ............... 29/846 |
| 2002/0198269 | A1 | 12/2002 | Zampini et al. |
| 2005/0244124 | A1 * | 11/2005 | Shelnut et al. ................. 385/129 |
| 2005/0277058 | A1 * | 12/2005 | Iwabuchi et al. .......... 430/270.1 |
| 2009/0148789 | A1 * | 6/2009 | Amara et al. .............. 430/270.1 |
| 2010/0270518 | A1 * | 10/2010 | Lin et al. ....................... 252/585 |
| 2011/0048707 | A1 * | 3/2011 | Kalman et al. ................ 166/279 |
| 2011/0083887 | A1 * | 4/2011 | Brock et al. .................. 174/258 |
| 2013/0143164 | A1 * | 6/2013 | Yabuki et al. ................. 430/311 |

FOREIGN PATENT DOCUMENTS

| EP | 1 369 908 A2 | 12/2003 |
| EP | 1 978 572 A2 | 10/2008 |
| JP | 6-148895 A | 5/1994 |
| WO | WO 2011/057832 A1 | 5/2011 |

OTHER PUBLICATIONS

Form PCT/ISA/220, Form PCT/ISA/210, and Form PCT/ISA/237 dated Jun. 11, 2013 for PCT/IB2013/000170, which corresponds to U.S. Appl. No. 13/369,809.

Dario L. Goldfarb et al., "Graded spin-on organic bottom antireflective coating for high NA Lithography," Advances in Resist Materials and Processing Technology XXV, edited by Clifford L. Henderson Proc. of SPIE vol. 6923, pp. 69230V-1-pp. 69230v-14 (2008).

Yasunobu Onishi et al. "Acid Catalyzed Resist For KrF Excimer Laser Lithography", Journal of Photopolymer Science and Technology, vol. 4, No. 3, pp. 337-pp. 340 (1991).

Daniel P. Sanders et al., "Self-segregating materials for immersion lithography", Advances in Resist Materials and Processing Technology XXV, edited by Clifford L. Henderson Proc. of SPIE vol. 6923, pp. 692309-1-pp. 692309-12 (2008).

Form PCT/IPEA/416 and Form PCT/IPEA/409 dated Feb. 20, 2014 for PCT/IB2013/000170, which corresponds to U.S. Appl. No. 13/269,809.

* cited by examiner

*Primary Examiner* — Amanda C. Walke
(74) *Attorney, Agent, or Firm* — Sangya Jain

(57) ABSTRACT

This invention relates generally to silicon based photoresist compositions that can be used in forming low k dielectric constant materials suitable for use in electronic devices, methods of their use and the electronic devices made therefrom.

7 Claims, No Drawings

LOW DIELECTRIC PHOTOIMAGEABLE COMPOSITIONS AND ELECTRONIC DEVICES MADE THEREFROM

BACKGROUND OF THE INVENTION

This invention relates generally to silicon based photoresist compositions that can be used in forming low k dielectric constant materials suitable for use in electronic devices, methods of their use and the electronic devices made therefrom.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer insulating material used in the components.

Siloxane based materials have been identified and used as low k materials for reducing the dielectric constant of such interlayer insulating material. Generally a siloxane layer is deposited onto a substrate followed by photolithographic processes which provide a siloxane based pattern after etching, into which metal lines, vias and other electronic components may be placed. Recently siloxane compositions which are photoimageable have been disclosed, wherein a photosensitive initiator reacts with the siloxane material, such as a functional siloxane polymer, when exposed to actinic radiation thereby altering its solubility to a developer.

Many siloxane polymers in these applications are characterized by a very low glass transition temperature (Tg) which results in liquid or tacky siloxane layers which are very difficult to process. Attempts to provide siloxane polymers with a high Tg and thus tack free coatings has resulted in brittle layers which are easily cracked, limiting both their use and the thicknesses which can be achieved. Hybrid silicon-carbon polymer systems have been proposed which address brittleness in interlayer dielectric coatings for microcircuit applications. U.S. Pat. No. 6,251,486 to Chandross et al disclose a modified methylsilsesquioxane composition for use as a low dielectric material. The methylsilsesquioxane includes dimethyl and phenyl pendant groups to provide better crack resistance than an all methylsilsesquioxane. Thus, crack resistance is achieved for the coated article through incorporation of the pendant groups into the polymer prior to coating. Addition of dimethylsiloxane to silicon polymers, however, results in tacky coatings. Flexibility of siloxane coatings has been obtained by additive functionalized polymers which crosslink with the siloxane polymer during exposure. The functionalized polymers suitable in these compositions are generally water insoluble which can lead to problems during development including scumming or overdevelopment of the image when trying to remove the scum. Coating thicknesses of siloxane compositions are low due, in part, to the low viscosity achievable with these components. Typically, adding more siloxane to the composition to increase solids is hampered by stability issues, as well as a limit on the viscosity attainable.

Thus there is a need for low k dielectric photoresists which are flexible, tack free, capable of forming thick coatings and readily developable with out degrading the resulting image.

SUMMARY OF THE DISCLOSURE

It has been surprisingly found that siloxane based photoresist compositions containing various water soluble polymers provide for improved flexibility and crack resistance as well as increasing the viscosity of the composition to allow for thicker coatings than those obtainable from siloxane based photoresist compositions alone. The composition of the present invention may be a negative tone composition or a positive tone composition.

In a first embodiment of the current application for patent is disclosed and claimed a photoimageable dielectric composition containing an alkali soluble polymer having at least one repeating unit of formula:

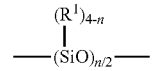

wherein the polymer has a plurality of functional end groups and wherein $R^1$ is a non-hydrolysable group and n is an integer ranging from 1 to 3 wherein the polymer is capable of being crosslinked with a crosslinking catalyst, a water soluble organic polymer miscible with the alkali soluble polymer, and a crosslinking catalyst which is selected from at least one of a photoacid generator and a photobase generator.

In a second embodiment of the current application for patent is disclosed and claimed the composition of the above embodiment wherein the functional end groups are chosen from the hydroxy, alkoxys, epoxies, oxetanes, vinyl ethers, maleimides, phenols, (meth)acrylates, thiols, carboxylic esters, carbonyl functionalities and sulphonate esters.

In a third embodiment of the current application for patent is disclosed and claimed the compositions of the above embodiments wherein the water soluble organic polymer has a glass transition temperature greater than about 100° C. and a dielectric constant less than about 10 and is present in the composition in an effective amount to improve flexibility in a dried state before and after photoimaging.

In a fourth embodiment of the current application for patent is disclosed and claimed the compositions of the above embodiments wherein the water soluble organic polymer is present in the composition in an effective amount to provide a coating greater than about 5 microns when coated.

In a fifth embodiment of the current application for patent is disclosed and claimed the compositions of the above embodiments wherein the composition provides a tack-free coating after depositing and drying.

In a sixth embodiment of the current application for patent is disclosed and claimed the compositions of the above embodiments wherein the water soluble organic polymer comprises monomeric units derive from monomers such as vinyl lactams, vinyl lactones, vinylimidazoles, vinylpyrrolidone, vinyl alcohols, vinyl acetates, or co-polymers thereof.

In a seventh embodiment of the current application for patent is disclosed and claimed the compositions of the above embodiments further containing a quencher.

In an eighth embodiment of the current application for patent is disclosed and claimed the compositions of the above embodiments wherein the non-hydrolysable group is selected from hydrogen, substituted alkyl, alkyl, substituted monocycloalkyl, monocycloalkyl, polycycloalkyl, substituted polycycloalkyl, substituted monocyclicaryl, monocyclic aryl, substituted polycyclic aryl, polycyclicaryl, substituted monocyclic aralkyl, monocyclic aralkyl, polycyclic aralkyl, substituted polycyclic aralkyl, carboxy and carbinol.

In a further embodiment of the current application for patent is disclosed and claimed a method for forming a dielectric image on a substrate containing the steps of coating the substrate with the composition of the above embodiments, heating the composition to substantially remove solvent, exposing the dried composition to actinic radiation through a photomask, optionally heating the exposed composition to further cure it, developing the composition using an aqueous alkaline developer to remove the unexposed portions of the composition, and optionally heating the resultant exposed and developed composition to further cure it, wherein the water soluble organic polymer is present in an effective amount to provide the desired thickness, flexibility and tack free surface.

In still a further embodiment of the current application for patent is disclosed and claimed a device prepared using any of the foregoing embodiments.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "[term]" refers to [definition].

The present disclosure relates to a photoimageable dielectric composition comprising an alkali soluble polymer having at least one repeating unit of formula:

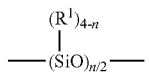

wherein the polymer has a plurality of functional end groups and wherein. $R^1$ is a non-hydrolysable group and n is an integer ranging from 1 to 3 wherein the polymer is capable of being crosslinked with a crosslinking catalyst, a water soluble organic polymer miscible with the alkali soluble polymer, and a crosslinking catalyst which is selected from at least one of a photoacid generator and a photobase generator. The functional end groups may be chosen from the epoxies, oxetanes, vinyl ethers, maleimides, phenols, (meth)acrylates, thiols, carboxylic esters, carbonyl functionalities and sulphonate esters.

The composition of the present invention may be a negative tone composition or a positive tone composition. In one embodiment of the present invention, a negative-tone composition is used.

The alkali soluble polymer can be solubilized by more than one mechanism. For example, the polymer may contain Si—OH functionalities that can react with an aqueous alkali developer thus solubilizing the polymer. $R^1$ may contain groups which react with the aqueous alkaline developer thus solubilizing the polymer, such as, for example, a phenol group. The alkali soluble polymer may be prepared from a number of siloxane monomers.

The polymers useful in the present disclosure include, for example, siloxanes, silsesquioxanes, and caged siloxanes and combinations thereof. The polymer may be present in the composition in an amount of from 1 to 99.5 wt %, for example from 60 to 98.5 wt %. Exemplary organic groups for $R^1$ include substituted and unsubstituted alkyl, substituted and unsubstituted aryl (which include aralkyl) and heterocyclic groups. The alkyl groups can be straight chain, branched or cyclic having, for example, from 1 to 20 carbon atoms, and typically have from 1 to 20 carbon atoms, such as methyl, ethyl, propyl, isopropyl, t-butyl, t-amyl, octyl, decyl, dodecyl, cetyl, stearyl, cyclohexyl, and 2-ethylhexyl. The alkyl groups can be substituted with heteroatoms in and/or on the alkyl chain, for example, or can be non-aromatic cyclic groups such as cyclopentyl, cyclohexyl, norbonyl, adamantyl, piperidinyl, tetrahydrofuranyl and tetrahydrothiophenyl groups. Exemplary aryl groups include those having from 6 to 20 carbon atoms, for example, from 6 to 15 carbon atoms, such as phenyl, tolyl, benzyl, ethylphenyl, 1-naphthyl, 2-naphthyl and 2-phenanthryl, and can be substituted with heteroatoms. Heterocyclic groups can be aromatic, for example, thiophene, pyridine, pyrimidine, pyrrole, phosphole, arsole, and furane. The exemplary organic groups may further be substituted with alkali soluble groups that react with the alkali soluble developer.

The polymer can take the form of a copolymer or higher order polymer, either random- or block-type. The polymer can include, for example, one or more additional silicon containing units, with the proportions for each unit ranging from 1 to 85 wt %, for example, from 15 to 80 wt % or from 25 to 60 wt %, or from 25 to 50 wt %, based on the polymer. The additional units can, for example, be represented as siloxanes, silsesquioxanes, cage siloxanes and/or combinations thereof. For example, the polymer can further include polymerized units of the formula $(R^2SiO_{1.5})$, wherein $R^2$ is a substituted or unsubstituted organic group as described above with respect to $R^1$. One of $R^1$ and $R^2$ can, for example, be chosen from substituted or unsubstituted alkyl groups, and the other of $R^1$ and $R^2$ chosen from substituted or unsubstituted aryl groups. The polymer can be, for example, an alkyl silicon polymer such as a copolymer containing methyl silsesquioxane units and butyl silsesquioxane units; an aryl silicon polymer such as a copolymer containing phenyl silsesquioxane units and trifluoromethylphenyl silsesquioxane units or an aralkyl silicon copolymer such as a copolymer containing methyl and phenyl silsesquioxane units.

As described above, the side chain groups of the polymer can be optionally substituted. "Substituted" means that one or more hydrogen atoms on the side chain groups is replaced by another substituent group, for example, deuterium, halogen such as fluorine, bromine, and chlorine, $(C_1$-$C_6)$alkyl, $(C_1$-$C_6)$ haloalkyl, $(C_1$-$C_{10})$alkoxy, $(C_1$-$C_{10})$ alkylcarbonyl, $(C_1$-$C_{10})$ alkoxycarbonyl, $(C_1$-$C_{10})$ alkylcarbonyloxy, alkyl amine, alkylsulfur containing materials, and the like. The polymers may contain a wide range of repeating units, either random or block. The polymers may have a weight average molecular weight (Mw)) of from about 500 to 15,000.

The polymers further include two or more functional end groups that allow curing or crosslinking to occur. Such end groups can be, for example, hydroxy (Si—OH) alkoxy (Si—Oalkyl) such as ethoxy, propoxy, isopropoxy; carboxyester, amino, amido, epoxy, imino, carboxyacid, anhydride, olefinic, acrylic, acetal, orthoester, vinyl ether, and combinations thereof. Of these, hydroxy groups are exemplary. The functional end content can be, for example, from about 0.5 to 35 wt % based on the polymer, for example from about 1 to 10 wt %, or from about 2 to 5 wt %.

The polymer can further, optionally include one or more siloxane units, for example, diphenyl or dimethyl-substituted siloxanes.

The described polymer materials can be prepared by known methods with readily available starting materials. For example, a 90:10 methyl-phenyl silsesquioxane containing copolymer can be synthesized by condensation reaction of 90 wt % methyltriethoxysilane and 10 wt % phenyltriethoxysilane.

The photoimageable dielectric composition of the present disclosure also includes a water soluble organic polymer miscible with the alkali soluble silicon polymer, and a crosslinking catalyst which is selected from at least one of a photoacid generator and a photobase generator. The water soluble polymer may be free of silicon.

It has been found that not all polymers are miscible with the silsesquioxane polymers of the present disclosure. Miscibility of the polymer is important for the integrity of the initial coating, the photolithographic process and the finally obtained dielectric images. Immiscibility can lead to undesirable developer attach and imperfections in the final images this compromising the dielectric functionality. Styrene-co-acrylate polymers are an example of polymers that are immiscible.

Water soluble polymers suitable for the present disclosure include, for example, comprise monomeric units derived from vinyl lactams, vinyl lactones, vinylimidazoles, vinylpyrrolidone, vinyl alcohols, vinyl acetates, or co-polymers thereof. Examples of such polymers are poly(vinylpyrrolidone-co-vinylacetate), polyvinyl pyrrolidone, polyvinyl acetates and combinations thereof. These polymers are not necessarily required to crosslink with the alkali soluble silicon polymer, although such crosslinking does not deter from the findings of the disclosure. The water soluble polymer has a glass transition temperature (Tg) of greater that 100° C., for example, 105° C. and, for example, 175-180° C. and a dielectric constant (k) of less than 10, for example less than 6, for example less than 4.

The water soluble polymer of the current disclosure may be chosen so that, in combination with the silsesquioxane polymer, a coating with a tack-free surface is achieved when the composition is coated and dried, as well as during further processing such as exposure, development and curing. An effective amount of the water soluble polymer to provide a tack-free coating is between about 0.1 wt % to about 35 wt % or, for example, from about 0.1 wt % to about 25 wt % or, for example, from about 0.5 wt % to about 20 wt %, such wt % being based on the weight of the silsesquioxane polymer of the composition. The tack-free surface will allow for on-contact printing as well as reduce or prevent any defects that may result from the contact of the coating surface with other materials.

The type and amount of water soluble polymer of the current disclosure may be chosen so that, in combination with the silsesquioxane polymer, the viscosity of the composition, when the polymer is present in an effective amount, will increase so that a single coating thickness up to 125 microns, or up to 100 microns, or up to 75 microns can be achieved. The novel composition is useful for coating film of greater than 5 microns, greater than 7 microns or greater than 10 microns. Thus by judicious manipulation of the water soluble polymer and the effective amount, a wide variety of coating thicknesses resulting from the coating process can be achieved. Such an effective amount is between about 0.1 wt % to about 35 wt % or, for example, from about 0.1 wt % to about 25 wt % or, for example, from about 0.5 wt % to about 20 wt %, such wt % being based on the weight of the silsesquioxane polymer of the composition.

The water soluble polymer of the current disclosure may be chosen so that, in combination with the silsesquioxane polymer, the composition is free from any cracking after coating, drying, photoexposing, developing, as well as after any curing steps, so that, the resulting obtained images are also free of any cracks. An effective amount of the water soluble polymer to provide crack-free coatings and images is between about 0.1 wt % to about 35 wt % or, for example, from about 0.1 wt % to about 25 wt % or, for example, from about 0.5 wt % to about 20 wt %, such wt % being based on the weight of the silsesquioxane polymer of the composition.

The photoacid generators useful in the present disclosure can be any compound or compounds which generate acid upon exposure to light. Suitable photoacid generators are known and include, but are not limited to, halogenated triazines, onium salts, sulfonated esters, substituted hydroxyimides, substituted hydroxylimines, azides, naphthoquinones such as diazonaphthoquinones, diazo compounds, and combinations thereof. Particularly useful halogenated triazines include, for example, halogenated alkyl triazines such as the trihalomethyl-s-triazines. The s-triazine compounds are condensation reaction products of certain methyl-trihalomethyl-s-triazines and certain aldehydes or aldehyde derivatives.

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulfonium salts such as aromatic sulfonium salts, sulfoxonium salts or selenium salts. Examples of suitable onium salts are disclosed, for example, in U.S. Pat. Nos. 4,442,197; 4,603,101; and 4,624,912. Sulfonium salts such as triphenylsulfonium hexafluorophosphate and mixtures thereof are examples. The sulfonated esters useful as photoacid generators in the present invention include, for example, sulfonyloxy ketones.

Suitable sulfonated esters include, but are not limited to, benzoin tosylate, t-butylphenyl alpha-(p-toluenesulfonyloxy)-acetate, 2,6-dinitrobenzyl tosylate, and t-butyl alpha (p-toluenesulfonyloxy)-acetate. Such sulfonated esters are disclosed, for example, in the *Journal of Photopolymer Science and Technology*, Vol. 4, No. 3, 337-340 (1991).

Substituted hydroxyimides which can be used include, for example, n-trifluoromethylsulfonyloxy-2,3-diphenylmaleimide and 2-trifluoromethylbenzenesulfonyloxy-2,3-diphenylmaleimide. Suitable substituted hydroxylimines include, for example, 2-(-nitrilo-2-methylbenzylidene)-(5-hydroxyiminobutylsulfonyl)-thiophene. Azides useful in the present invention include, for example, 2,6-(4-azidobenzylidene)cyclohexanone. Naphthoquinones can include, for example, 2,1-diazonaphthoquinone-4-sulfonate ester of 2,3,4-trihydroxybenzophenone.

Among the diazo compounds, 1,7-bis(4-chlorosulonyl phenyl)-4-diazo-3,5-heptanedione can be used.

Photobase generators useful in the present invention can be any compound or compounds which liberate base upon exposure to light. Suitable photobase generators include, but are not limited to, benzyl carbamates, such as for example, O-2-nitrobenzyl-N-cylclohexyl carbamate, benzoin carbamates, O-carbamoylhydroxyamines, O-carbamoyloximes, aromatic sulfonamides, alpha-lactams, N-(2-allylethenyl)amides, arylazide compounds, N-arylformamides, 4-(ortho-nitrophenyl) dihydropyridines, and combinations thereof.

Quenchers may also be added to the composition to help control the acid migration from the exposed areas to the unexposed areas. Quenchers are generally amine materials such as, for example, triethylamine, triethanolamine, aniline, ethylenediamine, pyridine, tetraalkylammonium hydroxide or its salts. The use of non volatile amine quenchers is also included. Other amines possess sterically hindered structures so as to hinder nucleophilic reactivity while maintaining basicity, low volatility and solubility in the resist formulation, such as, for example, a proton sponge, 1,5-diazabicyclo[4.3.0]-5-nonene, 1,8-diazabicyclo[5,4,0]-7-undecene, diisopropylaniline, cyclic alkylamines, melamine derivatives or polymers, glycourils or its derivatives, or polyether bearing amines such as described in U.S. Pat. No. 6,274,286.

The present compositions can optionally contain one or more solvents. Such solvents aid in formulating the present compositions and in coating the present compositions on a substrate. A wide variety of solvents may be used. Suitable solvents include, but are not limited to, glycol ethers, such as ethylene glycol monomethyl ether, propylene glycol monomethyl ether, dipropylene glycol monomethyl ether; esters such as methyl cellosolve acetate, ethyl cellosolve acetate, propylene glycol monomethyl ether acetate, dipropylene glycol monomethyl ether acetate, dibasic esters, carbonates such as propylene carbonate, γ-butyrolactone, esters such as ethyl lactate, n-amyl acetate and n-butyl acetate, alcohols such as n-propanol, iso-propanol, ketones such as cyclohexanone, methyl isobutyl ketone, diisobutyl ketone and 2-heptanone, lactones such as γ-butyrolactone and γ-caprolactone, ethers such as diphenyl ether and anisole, hydrocarbons such as mesitylene, toluene and xylene, and heterocyclic compounds such as N-methyl-2-pyrrolidone, N,N'-dimethylpropyleneurea, or mixtures thereof.

The current disclosure also relates to method of using the currently disclosed compositions. The composition of the present disclosure can be coated on a substrate using techniques well known to those skilled in the art, such as dipping, spin coating or spraying, curtain coating, roller, flood, screen, and slot coating. The coating and substrate are then heated on a hot plate or convection oven or other well known heating methods to substantially remove the solvent from the coating. As used herein the phrase "substantially remove the solvent" means to remove the solvent to the extent that any remaining solvent is at a concentration of less than about 5 wt %.

The coating and substrate are now imagewise exposed to actinic radiation. Exposure may be provided by a number of exposure tools well know in the industry using on-contact on contact or off-contact printing techniques. The actinic radiation suitable for the methods of the current disclosure include g-line, i-line, h-line radiation as well as semiconductor laser radiation such as, from example, KrF and ArF radiation, extreme UV radiation. Electron beam, and X-ray radiation, generally any radiation from about 450 nm to about 6 nm may be used for exposure.

The exposed areas of the coating may be cured sufficiently to withstand the development process described below. However, the coating and substrate may now optionally be heated to further cure the exposed areas of the coating using a hot plate or convection oven or other well known heating method. The coating is now developed in an aqueous alkaline developer which removes the unexposed areas of the coating. Suitable aqueous developers include, for example, alkali metal hydroxides such as sodium hydroxide and potassium hydroxide in water, as well as tetraalkylammonium hydroxide such as tetramethylammonium hydroxide, in water. Such developers are typically used in concentrations from 0.1 to 2N, for example, 0.15 to 1.0N, or 0.26 to 0.7N. The developer solutions may optionally include one or more known surfactants, such as polyethylene glycol, alkyl sulfonates, and other surfactants well known in the art. The surfactant is typically present in the developer in an amount of from 0.01 to 3 wt %. Antifoaming agents may also be advantageously included in the developer.

The resulting dielectric images may be further cured by further heating using heating techniques as described above.

The above compositions and methods are suitable for electronic devices and components in which dielectric materials are used. Such devices and components include dielectric layers in integrated circuitry for semiconductor devices, multichip modules, semiconductor packaging, passivation layers, redistribution layers, buffer layers, LCD devices, flat panel display devices, MEMS, Light emitting diodes, as well as other electronic devices.

EXAMPLES

Example 1

409.74 g of a 90:10 methyl:phenyl silsesquioxane polymer (69.0% solids in propylene glycol monomethyl ether acetate ((PGMEA)), 29.76 g of poly(vinylpyrrolidone-co-vinylacetate) polymer (50% solids in propylene glycol monomethyl ether (PGME) (available from Sigma-Aldrich), and 29.76 g of Irgacure-108 (20.0% solids in methyl iso-butyl ketone (MIBK); available from Ciba) were dissolved in PGME to achieve 60% of total solids.

The resulting photoimageable dielectric composition was filtered and spin coated onto a 6 inch silicon wafer and soft baked at 90° C. for 60 seconds to obtain a tack-free, crack-free film with a film thickness of 10.1 microns. The photoresist film was patternwise exposed to broadband light on an Ultratech stepper, and post-exposure baked at 80° C. for 60 seconds. This was followed by 30 second puddle development with a 2.38 wt % tetramethylammonium hydroxide (TMAH) developer to resolve features with a film thickness of 9.6 micron. Cross-sectional Scanning electron microscope (X-SEM) results showed that the composition and method resolved 1:1 contact hole with 10 micron critical dimension (CD), 1:1 post pattern with 10 micron CD and 1:1 trench pattern with 10 micron CD.

Two of the resulting patterned dielectric images were baked at 200° C. and 250° C. for 60 min on a hotplate under a nitrogen atmosphere, respectively. The cured dielectric films on chip were examined by X-SEM. No cracks were observed. In addition, neither CD shrinkage nor pattern profile change was observed.

The electrical properties of the dielectric film resulting from Example 1 were measured using a CVmap 92 system (C-V and I-V measurements). The dielectric constant was measured by MIS structure with a Hg probe and a value of 3.69 was obtained.

The mechanical properties were measured by nanoindentation method based on the standards for instrumented indentation, ASTM E2546 and ISO 14577. The modulus and hardness were 3.35 GPa and 0.19 GPa, respectively.

Example 2

84.12 g of a 90:10 methyl:phenyl silsesquioxane polymer (69.0% solids in PGMEA), 12.90 g of poly(vinylpyrrolidone-co-vinylacetate)polymer (50% solids in PGME) (available from Sigma-Aldrich), and 1.61 g of Irgacure-108 (20.0% solids in MIBK) were dissolved in PGME to achieve 64.6% of total solids.

The resulting photoimageable dielectric composition was filtered and spin coated onto a 8 inch silicon wafer and soft baked at 140° C. for 30 seconds to obtain a photoresist film. Then the same formulation was coated on top of the aforementioned wafer again (double coating) and soft baked at 140° C. for 300 seconds to obtain a photoresist film with a film thickness of over 150 microns. The photoresist film was patternwise exposed to broadband light on a Suss Aligner, and post-exposure baked at 80° C. for 80 seconds. This was followed by four times of 90 second puddle development step with a 2.38 wt % TMAH developer to resolve features with a film thickness of 130 micron. X-SEM results of the dielectric images exposed by broadband lithography showed isolated trench patterns with 30 micron target CD could be resolved as well as isolated trench patterns with 20 micron target CDs.

The resulting patterned dielectric film was then baked at 200° C. for 60 minutes on a hotplate under a nitrogen atmosphere. The cured dielectric films on chip were examined by X-SEM. No crack was observed. In addition, neither CD shrinkage nor pattern profile change was observed.

Example 3

164.39 g of a 90:10 methyl:phenyl silsesquioxane polymer (69.0% solids in PGMEA), 11.94 g of polyvinylpyrrolidone polymer (50% solids in PGME) (available from Sigma-Aldrich), and 11.94 g of Irgacure-108 (20.0% solids in MIBK) were dissolved in PGME to achieve 60% of total solids. The resulting photoimageable dielectric composition was filtered and spin coated onto a 6 inch silicon wafer and soft baked at 95° C. for 60 seconds to obtain a photoresist film with a film thickness of 10.5 microns. The photoresist films were patternwise exposed to broadband light on an Ultratech stepper, and post-exposure baked at 90° C./60 s, 95° C./60 s, and 100° C./60 s, respectively. This was followed by a 30 second puddle development step with a 2.38 wt % TMAH developer to resolve features with a film thickness of approximately 10 microns. The resulting patterned dielectric film was then baked at 250° C. for 60 minutes on a hotplate under a nitrogen atmosphere.

The cured dielectric films on chip were examined by X-SEM. No cracks were observed. In addition, neither CD shrinkage nor pattern profile change was observed. 1:1 dense trench patterns with 10 micron CD were readily resolved. The resulting patterned dielectric film was then baked at 250° C. for 60 min on a hotplate under a nitrogen atmosphere. The cured dielectric films on chip were examined by X-SEM. No crack was observed. In addition, neither CD shrinkage nor pattern profile change was observed.

Example 4

252.06 g of a 90:10 methyl:phenyl silsesquioxane polymer (71.30% solids in PGMEA), 39.94 g of poly(vinylpyrrolidone-co-vinylacetate) polymer (50% solids in PGME) (available from Sigma-Aldrich), and 9.98 g of Irgacure-108 (20.0% solids in MIBK) were dissolved in PGMEA to achieve 66.8% of total solids. The resulting photoimageable dielectric composition was filtered and spin coated onto a 6 inch silicon wafer and soft baked at 140° C. for 300 seconds followed by another coating and soft bake at 140° C. for 300 seconds to obtain a film with a film thickness of about 80 um. The photoresist film was patternwise exposed to broadband light on a Suss Aligner, and post-exposure baked at 80° C. for 80 seconds. This was followed by three 60 second puddle development with a 2.38 wt % tetramethylammonium hydroxide (TMAH) developer to resolve features of 40 micron lines with a film thickness of about 80 microns. Two of the resulting patterned dielectric images were baked at 200° C. for 60 minutes with temperature ramping on a hotplate under a nitrogen atmosphere. The cured dielectric films on chip were examined by microscope and no cracks were observed.

Comparative Example 21.25 g of a 90:10 methyl:phenyl silsesquioxane polymer (69.0% solids in PGMEA), and 0.146 g of NIN PAG, (N-Hydroxynaphthalimide nonaflate, available from Toyo Gosei, Tokyo, Japan) were dissolved in PGMEA to achieve 59% of total solids.

The resulting photoimageable dielectric composition was filtered and spin coated onto a 6 inch silicon wafer and soft baked at 90° C. for 120 seconds to obtain a photoresist film with a film thickness of 10.1 microns. The photoresist film was patternwise exposed to i-line (365 nm) light on an ASML stepper and post-exposure baked at 60° C. for 30 seconds. This was followed by 30 second puddle development steps with a 2.38 wt % TMAH developer to resolve features with a film thickness of 9.6 microns.

The resulting patterned dielectric film was then baked at 250° C. for 30 minutes on a hotplate under a nitrogen atmosphere, respectively. The cured dielectric films on chip were examined by optical microscope. Severe cracks were observed. Thus, films of only 9.6 microns gave severely cracked film and so thicker coatings are not lithographically useful with this composition.

The invention claimed is:

1. A photoimageable dielectric composition comprising:
   (a) an alkali soluble polymer having at least one repeating unit of formula:

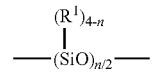

having a plurality of functional end groups, where $R^1$ is a non-hydrolysable group and n is an integer ranging from 1 to 3 where the polymer is capable of being crosslinked with a crosslinking catalyst,
   (b) a water soluble organic polymer miscible with the alkali soluble polymer, and
   (c) a crosslinking catalyst which is selected from at least one of a photoacid generator and a photobase generator.

2. The composition of claim 1 wherein the non-hydrolysable group is selected from hydrogen, substituted alkyl, alkyl, substituted monocycloalkyl, monocycloalkyl, polycycloalkyl, substituted polycycloalkyl, substituted monocyclicaryl, monocyclic aryl, substituted polycyclic aryl, polycyclicaryl, substituted monocyclic aralkyl, monocyclic aralkyl, polycyclic aralkyl, substituted polycyclic aralkyl, carboxy and carbinol.

3. The composition of claim 1, wherein the functional end groups are chosen from hydroxy, alkoxys, epoxies, oxetanes, vinyl ethers, maleimides, phenols, (meth)acrylates, thiols, carboxylic esters, carbonyl functionalities and sulphonate esters.

4. The composition of claim 1, wherein the water soluble organic polymer has a glass transition temperature greater than about 100° C. and a dielectric constant less than about 10.

5. The composition of claim 1, wherein the water soluble organic polymer miscible with the alkali soluble polymer is present in the composition in an amount of 0.1 to 35 wt %.

6. The composition of claim 1 further comprising a quencher.

7. The composition of claim 1, wherein the water soluble organic polymer comprises monomeric units derived from vinyl lactams, vinyl lactones, vinylimidazoles, vinylpyrrolidone, vinyl alcohols, vinyl acetates, or co-polymers thereof.

* * * * *